US005935648A

United States Patent [19]

Roberson et al.

[11] Patent Number: 5,935,648

[45] Date of Patent: Aug. 10, 1999

[54] HIGH SURFACE AREA MOLYBDENUM NITRIDE ELECTRODES

[75] Inventors: Scott L. Roberson, Cary, N.C.; Duane Finello, Sahlimar, Fla.; Robert F. Davis, Raleigh, N.C.

[73] Assignee: The United States of America as represented by the Secretary of the Air Force, Washington, D.C.

[21] Appl. No.: 08/825,488

[22] Filed: Mar. 28, 1997

[51] Int. Cl.[6] .................................................... C23C 16/00

[52] U.S. Cl. .................................... 427/255.2; 427/255.1

[58] Field of Search .................................... 361/528, 516, 361/532, 508; 204/292; 429/40; 427/77, 78, 226, 227, 228, 248.1, 255.1, 255.2, 372.2, 419.2

[56] References Cited

U.S. PATENT DOCUMENTS

| | | | |
|---|---|---|---|
| 5,151,848 | 9/1992 | Finello | 361/502 |
| 5,378,501 | 1/1995 | Foster et al. | 427/255.2 |
| 5,487,923 | 1/1996 | Min et al. | 427/255.2 |
| 5,618,579 | 4/1997 | Boire et al. | 427/255.2 |
| 5,656,338 | 8/1997 | Gordon | 427/255.2 |
| 5,680,292 | 10/1997 | Thompson, Jr. et al. | 361/528 |

OTHER PUBLICATIONS

Preparation of High Surface–Area Transition–Metal Nitrides: $Mo_2N$ and MoN, Chemistry of Materials, 1990, 2, 150(1990), Jaggers et al. no month available.

*Primary Examiner*—Bruce F. Bell

*Attorney, Agent, or Firm*—Bobby D. Scearce; Thomas L. Kundert

[57] ABSTRACT

High surface area $Mo_2N$ or MoN electrodes for use in high energy density energy storage devices, and processes for fabricating the electrodes, are described wherein a precursor molybdenum solution is applied to a metallic foil substrate which is heated to produce a $MoO_3$ coating on the substrate, which coating is converted to $Mo_2N$ and MoN by reaction with ammonia. $Mo_2N$ and MoN electrodes are also produced in a chemical vapor deposition process in which molybdenum pentachloride carried by an inert gas and ammonia are the reaction gases for producing $Mo_2N$ and MoN films.

3 Claims, 1 Drawing Sheet

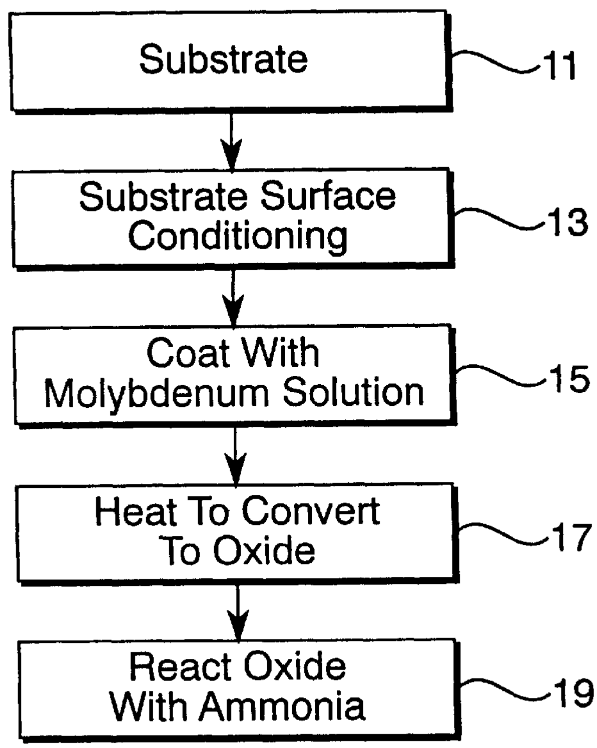
Fig. 1
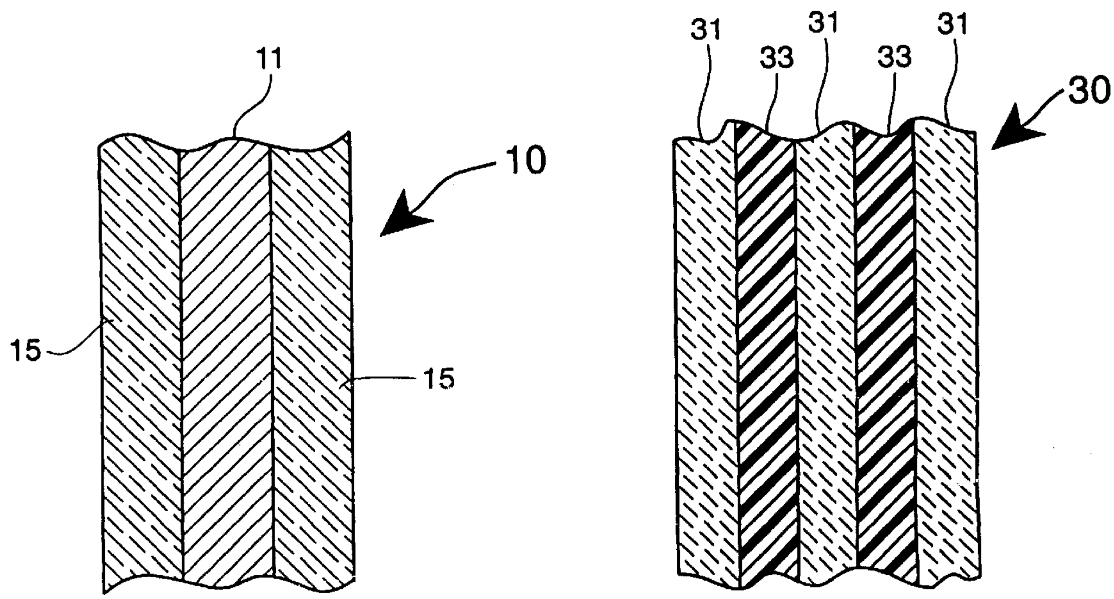
Fig. 2
Fig. 3

HIGH SURFACE AREA MOLYBDENUM NITRIDE ELECTRODES

RIGHTS OF THE GOVERNMENT

The invention described herein may be manufactured and used by or for the Government of the United States for all governmental purposes without the payment of any royalty.

BACKGROUND OF THE INVENTION

The present invention relates generally to energy storage devices, such as capacitors, and more particularly to high surface area electrodes for use in fabricating high energy density storage capacitors for low voltage applications.

Technology related to the invention is described in U.S. Pat. No. 5,151,848 to Finello, entitled "Supercapacitor," the entire teachings of which are incorporated here by reference. In Finello '848 a supercapacitor and process for making it are described wherein a pair of ruthenia coated titanium electrodes are placed about a membrane of solid polymer electrolyte, which assembly is placed into a high pressure shock apparatus for impregnation of the polymer into the porous electrodes.

In accordance with the teachings of the present invention, high surface area molybdenum nitride ($Mo_2N$ and MoN) electrodes may be fabricated by a process of coating a metallic substrate with molybdenum oxide ($MoO_3$) and subsequent topotactic conversion of the $MoO_3$ to $Mo_2N$ and MoN by reaction with anhydrous ammonia to form a high surface area $Mo_2N$ and MoN adherent coating bonded to the substrate, or by an alternative process of depositing (as by chemical vapor deposition (CVD)) molybdenum pentachloride ($MoCl_5$) and subsequent reaction with ammonia ($NH_3$) to form an adherent $Mo_2N$ and MoN coating on a metallic or nonmetallic substrate.

Electrodes fabricated according to the invention can be incorporated into an ultracapacitor structure exhibiting high energy density (greater than one farad/$cm^2$ of electrode sheet) at cell voltages to the limit of the electrolyte. Double-sided coated electrodes of the invention may be incorporated into bipolar cell stacks or rolled single cells. High energy density ultracapacitors structured using electrodes of the invention find substantial utility in devices requiring compact, low voltage energy sources which can be powered up after long periods of idle storage, such as in electric vehicles, rechargeable appliances and electronics, industrial robotics, portable power supplies for welding, demolition, mining, etc, medical electronics, defibrillators and wing de-icing.

It is therefore a principal object of the invention to provide a high surface area electrode.

It is another object of the invention to provide a process for fabricating high surface area electrodes.

It is yet another object of the invention to provide high surface area $Mo_2N$ and MoN electrodes for use in energy storage devices.

It is a further object of the invention to provide an improved high energy density capacitor.

These and other objects of the invention will become apparent as a detailed description of representative embodiments proceeds.

SUMMARY OF THE INVENTION

In accordance with the foregoing principles and objects of the invention, high surface area $Mo_2N$ or MoN electrodes for use in high energy density energy storage devices, and processes for fabricating the electrodes, are described wherein a precursor molybdenum solution is applied to a metallic foil substrate which is heated to produce a $MoO_3$ coating on the substrate, which coating is converted to $Mo_2N$ and MoN by reaction with ammonia. $Mo_2N$ and MoN electrodes are also produced in a chemical vapor deposition process in which molybdenum pentachloride carried by an inert gas and ammonia are the reaction gases for producing $Mo_2N$ and MoN films.

BRIEF DESCRIPTION OF THE DRAWINGS

The invention will be more clearly understood from the following detailed description of representative embodiments thereof read in conjunction with the accompanying drawings wherein:

FIG. 1 is a block diagram of the process steps for fabricating high surface area electrodes according to the invention;

FIG. 2 shows a schematic cross section of a representative electrode fabricated according to the invention; and FIG. 3 shows a schematic cross section of a representative capacitor structure including electrodes fabricated according to the invention.

DETAILED DESCRIPTION

Referring now to the drawings, FIG. 1 shows a block diagram of the process steps according to the invention for fabricating high surface area electrodes by incorporating spray pyrolysis of $MoCl_5$ plus methanol/water to produce $MoO_3$ and subsequent conversion to $Mo_2N$ and MoN. In accordance with a governing principle of the invention, it is noted that transition metal nitrides, such as $Mo_2N$ and MoN, exhibit metallic resistivity below $10^{-5}$ ohm-cm and a high surface area in substantially comminuted form upon the topotactic conversion of the oxide ($MoO_3$) to the nitride ($Mo_2N$ and MoN) by reaction with anhydrous ammonia. Reference is also made to FIG. 2 which shows a cross section of a representative electrode 10 fabricated according to the invention. A substrate 11 of titanium, zirconium, molybdenum, tantalum, stainless steel or other metal or alloy foil (preferably about 0.5 to 2.0 mils thick) is preferably first surface treated as at 13 by sanding or roughening or etching in a suitable etchant such as HCl, $H_2SO_4$ or $HNO_3$ at 90° C. for about five minutes in order to condition substrate 11 surfaces for accepting an oxide coating, to optimize the bonding of the $MoO_3$ (and the $Mo_2N$ and MoN after conversion) to substrate 11, and to maximize the surface area of the $Mo_2N$ and MoN upon conversion from the $MoO_3$. Nitriding of etched or roughened titanium substrates in ammonia at 700° C. for about 30 minutes reduces oxide contamination and increases adherence of the $Mo_2N$ and MoN films. To conditioned substrate 11 is applied coating 15 of molybdenum solution such as a solution of ammonium molybdate, molybdenum chloride, molybdenum trichloride, molybdenum pentachloride or molybdenum oxychloride in water, methanol, acetone or other suitable solvent. Coating 15 solution may be applied using any suitable process, such as spray pyrolysis, dip coating and baking, ultrasonic spray, roll coating, or other suitable liquid spray deposition process as would occur to the skilled artisan guided by these teachings. Adhesion and surface area characteristics of resulting $Mo_2N$ and MoN coatings may be enhanced by the addition of nucleating agents such as iron chloride, tin chloride, zinc chloride, titanium chloride or the like to the coating 15 solution. Electrodes fabricated according to the invention preferably comprise $Mo_2N$ and MoN coatings having thickness in the range of about 0.25 to 1.0 mils on substrate 11, and, accordingly, spray pyrolysis or dip coating may be preferable as the most economical and efficient methods for applying coating 15. Spray pyrolysis or painting may be used to apply different coatings or coating thicknesses on opposite sides of substrate 11 for use in bipolar battery or capacitor structures requiring different anode or cathode materials or thicknesses back-to-back. The coated substrate 11 is then heated as at 17 in air to sufficient temperature (usually about 250° C. to 650° C.) to convert coating 15 to $MoO_3$.

Coated substrate 11 is then heated as at 19 in an atmosphere of anhydrous ammonia under controlled temperature, pressure and flow conditions in order to convert the $MoO_3$ coating to a highly adherent, high surface area $Mo_2N$ and MoN coating. The $MoO_3$ coated substrate 11 may be heated in any suitable manner as would occur to the skilled artisan guided by these teachings to achieve the controlled reaction of ammonia with the $MoO_3$ coating, such as in a resistive, inductive or infrared furnace in a controlled atmosphere of anhydrous ammonia. Anhydrous ammonia flow rates of about nine liters/minute at atmospheric pressure resulted in substantially complete conversion of the oxide coating to nitride. Slow ramp heating (over several hours) from about 320° C. to 580° C. at about 20° C. per hour, and from about 580° C. to 740° C. at about 160° C. per hour, and an additional 740° C. soak for about two hours, resulted in high surface area formation of $Mo_2N$ and MoN. Higher ammonia pressure accelerates the reaction significantly.

In demonstration of the invention, a mixture of 5–10 weight percent $MoCl_5$ dissolved in methanol or distilled water was sprayed with a PYREX thin layer chromatography sprayer onto 2.5 inch square titanium and zirconium foil substrates one mil thick, heated to 500° C. and allowed to convert to $MoO_3$. Heating the $MoO_3$ under flowing ammonia produced $Mo_2N$ and MoN coating thicknesses of 0.75±0.05 mil which exhibited substantial adhesion to substrate 11 as confirmed by tape peeling and scribing tests.

Samples of $Mo_2N$ and MoN coated titanium and zirconium foil electrodes (1 $cm^2$) prepared as just described were tested for capacitance in an EE&G Princeton Applied Research Model 379 Digital Coulometer in two different electrolytes consisting of potassium iodide in nitromethane, and water plus 16% $H_2SO_4$. The samples were placed facing each other separated by Whatman filter paper in the nitromethane electrolyte and separated by Tefzel Scimat 200 in $_2SO_4$ electrolyte. Samples were charged for five minutes each at 0.5 volts and allowed to discharge for five minutes. The samples were soaked in distilled water, rinsed in alcohol and allowed to dry before testing again in a different electrolyte. Capacitance was determined by dividing the coulomic charge by applied voltage. The samples were tested against ruthenium oxide electrodes rated at 1 Farad/$cm^2$. The results of the tests are presented in Table I. In addition, electrodes fabricated according to the invention were evaluated using cyclic voltametry and AC impedence spectroscopy and indicated stability in either acidic or basic aqueous electrolytes.

Alternative deposition methods which may be used to produce films according to the invention include, but are not necessarily limited to, ion beam deposition, molecular beam epitaxy, laser sputtering, plasma spraying and CVD. These methods allow for direct growth of $Mo_xN$, without the growth of an oxide precursor layer, and allow production of less contamination in $Mo_xN$ films because of the reduced oxygen.

A CVD process according to the invention comprises the following: (1) a solid source metal organic stainless steel CVD bubbler is used to contain a molybdenum source of molybdenum hexacarbonyl or other volatile (high vapor pressure) molybdenum compound not containing free oxide. The bubbler is typically filled under argon with 50 grams of $MoCl_5$ and stored under argon pressure to avoid air contamination. Once deposition is begun, the bubbler and cell gas delivery lines to the deposition region are heated to about 40° C. to 140° C. depending on the desired growth rate. To initiate the deposition process, the bubbler valves are opened and a carrier gas (nitrogen or other ultra high purity gas) is flowed into the bubbler where it is saturated with $MoCl_5$ vapor. The carrier gas/source gas mixture is then delivered to the deposition region (substrate). The CVD process may use any of the substrates used in the spray pyrolysis process and, additionally, aluminum and nonmetallics, as would occur to the skilled artisan guided by these teachings.

The substrate may be heated by resistance, RF or other suitable method. Substrate materials may include aluminum and nonmetallics which may be heated to about 230° C. to 800° C. depending on the gas pressure and selected substrate material. The $MoCl_5$/carrier gas mixture reacts with ammonia (delivered to the deposition region by separate gas conduits at about 0.5 to 3 liters/min) as it is deposited on the substrate. At elevated temperature $MoCl_5$ reacts with ammonia to produce $Mo_2N$ and MoN. Prior to deposition, the CVD system is evacuated to about $10^{-2}$ torr and backfilled with nitrogen to about 1000 torr (this process may be repeated to substantially eliminate oxygen from the system). CVD samples of $Mo_2N$ and MoN films so produced were tested using the methods described above for the converted $MoO_3$ samples. Results are shown as the last two entries in Table I. Evaluation of the CVD $Mo_2N$ and MoN films using cyclic voltametry and AC impedence spectroscopy indicate electrochemical stability and capacitance comparable to the spray pyrolysis samples.

FIG. 3 shows a schematic cross section of a representative capacitor structure 30 including electrodes 31 fabricated according to the invention. One or more electrodes 31 may be disposed in contact with suitable electrolyte 33 to define the reusable charge storage structure 30. Any electrolyte 33 compatible with electrode 31 composition may be used as selected by one skilled in the art guided by these teachings, including, but not limited to, room temperature liquid salts, propylene carbonate, lithium perchlorate and sulfuric acid solution. Because of their superior high temperature stability, high surface area molybdenum nitride electrodes made according to the invention can be bridged and electrically isolated with glass to facilitate hermetic sealing of ultracapacitor multicell stacks.

The invention therefore provides a high surface area $Mo_2N$ and MoN coated electrode for use in high density energy storage devices, such as high energy density capacitors, and a process for fabricating the electrodes. It is understood that modifications to the invention may be made as might occur to one with skill in the field of the invention within the scope of the appended claims. All embodiments contemplated hereunder which achieve the objects of the invention have therefore not been shown in complete detail. Other embodiments may be developed without departing from the spirit of the invention or from the scope of the appended claims.

TABLE I

| Sample | Heat Treatment | Flow Rate (sccm) | Thickness (mils) | Volts | Coulombs | Capacitance (farads) Nitromethane | $H_2SO_4$ |
|---|---|---|---|---|---|---|---|
| 7-JY | 23–700° C. 1 h<br>700–300° C. 1 h<br>300–23° C. 1 h | 2500 | 1 | 0.5 | $5.42E^{-2}$ | 0.1084 | |
| 7-JY | | | | 0.5 | $1.65E^{-1}$ | | 0.33 |
| 19-JY | 23–350° C. 1 h<br>350–450° C. 1 h<br>450–550° C. 1 h<br>550–700° C. ½ h | 2500 | 1 | 0.5 | $5.43E^{-2}$ | 0.1085 | |
| 19-JY | | | | 0.5 | $1.64E^{-1}$ | | 0.34 |
| 20-JY | oxidized prior to nitriding at 300° C. for 3 h<br>300–350° C. ¼ h<br>350–450° C. 1 h<br>450–550° C. 1 h<br>550–700° C. ½ h | 2500 | 1 | 0.5 | $6.78E^{-2}$ | 0.1356 | |
| 20-JY | | | | 0.5 | $2.62E^{-1}$ | | 0.53 |
| Ruthenia | oxidized at 300° C.<br>sample was delivered as a 1 farad/$cm^2$ electrode. | | | 0.5 | $3.77E^{-1}$ | | 0.75 |
| 11695 | 0–320° C. for 1 h<br>320–580° C. 13 h<br>580–740° C. 1 h<br>450–550° C. 1 h<br>740° C. 1 h | 7000 | 0.75 | 0.5 | 0.265 | | 0.54 |
| CVD-4 | CVD at 600° C. | 1500 | 0.5 | 0.5 | 0.267 | | 0.54 |

We claim:

1. A process for fabricating a high surface area molybdenum nitride electrode, comprising the steps of:

(a) providing a substrate for receiving a vapor deposited film;

(b) providing a source of molybdenum pentachloride vapor and a source of gaseous anhydrous ammonia;

(c) flowing a mixture of said molybdenum pentachloride vapor and said gaseous anhydrous ammonia onto said substrate; and (d) heating said substrate in the presence of said mixture of said molybdenum pentachloride vapor and said gaseous anhydrous ammonia to produce a vapor deposited film of molybdenum nitride on said substrate.

2. The process of claim 1 wherein said substrate comprises aluminum, titanium, zirconium, molybdenum, tantalum or stainless steel.

3. The process of claim 1 wherein the step of heating said substrate in the presence of said mixture of said molybdenum pentachloride vapor and said gaseous anhydrous ammonia is performed at a temperature in the range of about 230 to 800° C.

* * * * *